(12) United States Patent  
Noda et al.

(10) Patent No.: US 7,679,117 B2  
(45) Date of Patent: Mar. 16, 2010

(54) SOLID-STATE IMAGE SENSING DEVICE EQUIPPED WITH INNER LENS

(75) Inventors: Tomoyuki Noda, Atsugi (JP); Yuya Fujino, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 28 days.

(21) Appl. No.: 12/105,354

(22) Filed: Apr. 18, 2008

(65) Prior Publication Data

US 2008/0191301 A1    Aug. 14, 2008

Related U.S. Application Data

(63) Continuation of application No. 11/477,418, filed on Jun. 30, 2006, now Pat. No. 7,382,011.

(30) Foreign Application Priority Data

Jul. 4, 2005    (JP) .............................. 2005-195281

(51) Int. Cl.  
*H01L 31/062* (2006.01)  
*H01L 31/113* (2006.01)

(52) U.S. Cl. ................ 257/294; 257/292; 257/E31.122

(58) Field of Classification Search ................ 257/291, 257/292, 294, 432, E31.121, E31.122, E27.131, 257/E27.132, E27.133, E27.134

See application file for complete search history.

(56) References Cited

U.S. PATENT DOCUMENTS

| 2005/0110002 | A1 | 5/2005 | Noda ........................... 257/21 |
| 2006/0038209 | A1* | 2/2006 | Hashimoto ................... 257/294 |
| 2007/0115377 | A1 | 5/2007 | Noda et al. .................. 348/294 |

FOREIGN PATENT DOCUMENTS

JP    2005-012189    1/2005

* cited by examiner

*Primary Examiner*—Minh-Loan T Tran  
*Assistant Examiner*—Vongsavanh Sengdara  
(74) *Attorney, Agent, or Firm*—Fitzpatrick, Cella, Harper & Scinto

(57) ABSTRACT

A solid-state image sensing device having an effective pixel area and an optical black area disposed on one principal surface of a substrate, includes photoelectric converter elements, a wiring part containing a plurality of wiring layers disposed on the one principal surface of the substrate, in which in the optical black area more wiring layers are disposed than in the effective pixel area, an interlayer dielectric disposed between, among the plurality of wiring layers, a topmost first wiring layer and a second wiring layer disposed beneath the first wiring layer, a passivation film disposed on the interlayer dielectric in the effective pixel area and disposed on the first wiring layer in the optical black area, and inner lenses disposed at least at positions on the passivation film that corresponds to the effective pixel area, a thickness of the passivation film being equal to or less than a thickness of the first wiring layer.

7 Claims, 16 Drawing Sheets

SOLID-STATE IMAGE SENSING DEVICE
EQUIPPED WITH INNER LENS

CROSS REFERENCE TO RELATED
APPLICATION

This application is a continuation of U.S. application Ser. No. 11/477,418, filed Jun. 30, 2006, the entire disclosure of which is hereby incorporated by reference herein.

FIELD OF THE INVENTION

The present invention relates to a solid-state image sensing device, and more particularly, to a solid-state image sensing device equipped with an inner lens.

BACKGROUND OF THE INVENTION

Recently, solid-state image sensing devices have come to be used in image input apparatuses such as digital cameras, video cameras and image readers. As such solid-state image sensing devices, there are CCD image sensors as well as such non CCD-type image sensors as bipolar transistor-type image sensors, field effect transistor-type image sensors and CMOS image sensors. With such image input apparatuses, optical image information (an optical image) is converted into electrical signals by a photoelectric converter and the converted electrical signals are signal-processed and displayed on a display unit, recorded on a storage medium, and so forth.

To obtain a higher performance solid-state image sensing device, it is desirable to reduce the surface area (pixel surface area) of the light-receiving surface of the photoelectric conversion element that is the photoelectric converter that actually converts the optical image into electrical signals and increase the number of photoelectric converter elements deployed, while at the same time reducing the solid-state image sensing device chip size.

However, with continued advances in high-density pixel integration and chip size reduction, the quantity of light that a single photoelectric converter element which constitutes a pixel can receive decreases as the surface area of the light-receiving surface decreases, and thus decreasing the sensitivity of the device. To remedy this situation, a technology is known that reduces the decrease in sensitivity by forming a microlens on a flattened protective film provided on the light-receiving surface and concentrating incoming light on the light-receiving surface.

In addition, with the demand for even further high-density pixel integration and chip size reduction, the need to provide an inner lens between the microlens and the photoelectric converter element, composed of a film having a refractive index different from those of the adjacent layers, increases.

For example, Japanese Patent Application Laid-Open No. 2005-012189 discloses a solid-state image sensing device having a microlens and an inner convex lens. A brief description is given of the configuration of the solid-state image sensing device disclosed in Japanese Patent Application Laid-Open No. 2005-012189 using FIG. 15.

In FIG. 15, reference numeral 13 indicates a semiconductor member, 1 indicates photoelectric converter elements formed within the semiconductor member and 2 represents an element separation area. Reference numeral 4 indicates a first wiring pattern and 6 indicates a second wiring pattern, with the first wiring pattern 4 and the second wiring pattern 6 separated by a first dielectric 3 and a second dielectric 5. A third dielectric 7 above the second wiring pattern 6 is flattened, after which the inner convex lens 8 are formed. Further, the tops of the inner convex lens 8 are flattened by a first flattening film 9, after which a color filter layer 10 is formed, further flattened by a second flattening film 11, and microlenses 12 formed thereafter. Reference numeral 14 indicates a pad part. With such a technique, it is said, the inner convex lens 8 can be formed with precision, enabling the light collecting efficiency to be increased without substantially reducing sensitivity.

A description is now given of an instance in which a solid-state image sensing device having a light-shielded area on an edge part of the photoelectric converter element is designed on the basis of Japanese Patent Application Laid-Open No. 2005-012189, with reference to FIG. 16.

FIG. 16 shows a sectional view of the edge of a solid-state image sensing device including a light-receiving area and a light-shielded area. In FIG. 16, reference numeral 101 indicates a light-shielded area pixel, 102 indicates a light-receiving area pixel, 103 indicates photosensitive areas (photoelectric converter elements), 104 indicates a first metal wiring layer, 105 indicates a second metal wiring layer, and 106 indicates a third metal wiring layer that blocks incoming light. Most of the photoelectric converter elements 103, the first metal wiring layer 104, the second metal wiring layer 105 and the third metal wiring layer 106 are physically and electrically separated from each other by interlayer dielectrics, with portions connected by contact plugs and via plugs. It should be noted that the pixel shielded from incoming light by the third metal wiring layer 106 becomes the light-shielded area pixel, with the third metal wiring layer 106 configured so as not to intrude upon the light-receiving area pixel 102. In addition, reference numeral 112 indicates a flattening film that covers the height difference created by the third metal wiring layer 106, and is formed so as to provide a uniform surface for the formation of inner lenses 108 described later. Reference numeral 107 indicates a passivation layer and 108 indicates the inner lenses. After formation of the inner lenses 108, a flattening film 109 is formed to attain a flat surface, on which a color filter layer 110 is. Thereafter further flattening is performed using flattening layer 109 is further formed to attain a flat surface, on which microlenses 111 are formed.

However, as shown in FIG. 16, if the solid-state image sensing device is configured using the technique shown in FIG. 15, the distance from the light-receiving surface to the bottom of the inner lenses lengthens, and conversely light collecting efficiency worsens.

SUMMARY OF THE INVENTION

The present invention has been made in consideration of the above-described situation, and has as its object to shrink the distance from the light-receiving surface to the bottom of the inner lens and to increase light-collecting efficiency without decreasing sensitivity.

According to the present invention, the foregoing object is obtained by providing a solid-state image sensing device having an effective pixel area that carries out photoelectric conversion according to a quantity of incident light and an optical black area for creating a reference signal, the effective pixel area and the optical black area disposed on one principal surface of a substrate, the solid-state image sensing device comprising:

photoelectric converter elements;

a wiring part containing a plurality of wiring layers disposed on the one principal surface of the substrate, in which in the optical black area more wiring layers are disposed than in the effective pixel area;

an interlayer dielectric disposed between, among the plurality of wiring layers, a topmost first wiring layer and a second wiring layer disposed beneath the first wiring layer;

a passivation film disposed on the interlayer dielectric in the effective pixel area and disposed on the first wiring layer in the optical black area; and inner lenses disposed at least at positions on the passivation film that corresponds to the effective pixel area, wherein a thickness of the passivation film is equal to or less than a thickness of the first wiring layer.

Other features and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings. However, the dimensions, shapes and relative positions of the constituent parts shown in the embodiments should be changed as convenient depending on various conditions and on the structure of the apparatus adapted to the invention, and the invention is not limited to the embodiments described herein.

First Embodiment

A description will now be given of a first embodiment of the present invention.

Figure 1:
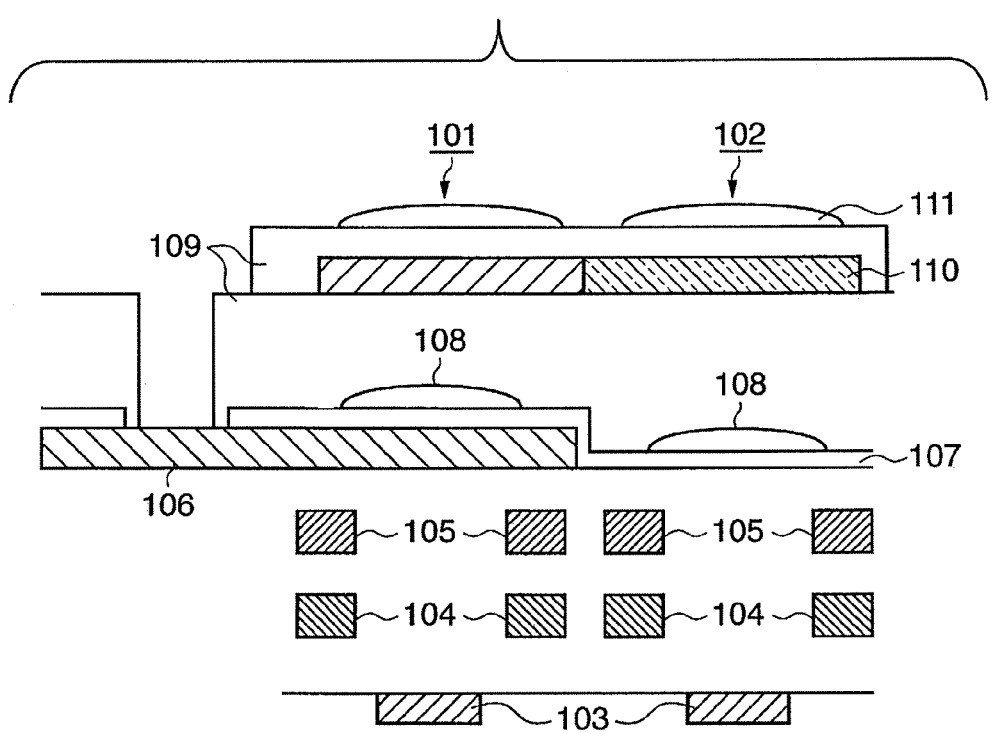
FIG. 1 is a sectional view of the configuration of a solid-state image sensing device according to a first embodiment of the present invention.
Figure 16:
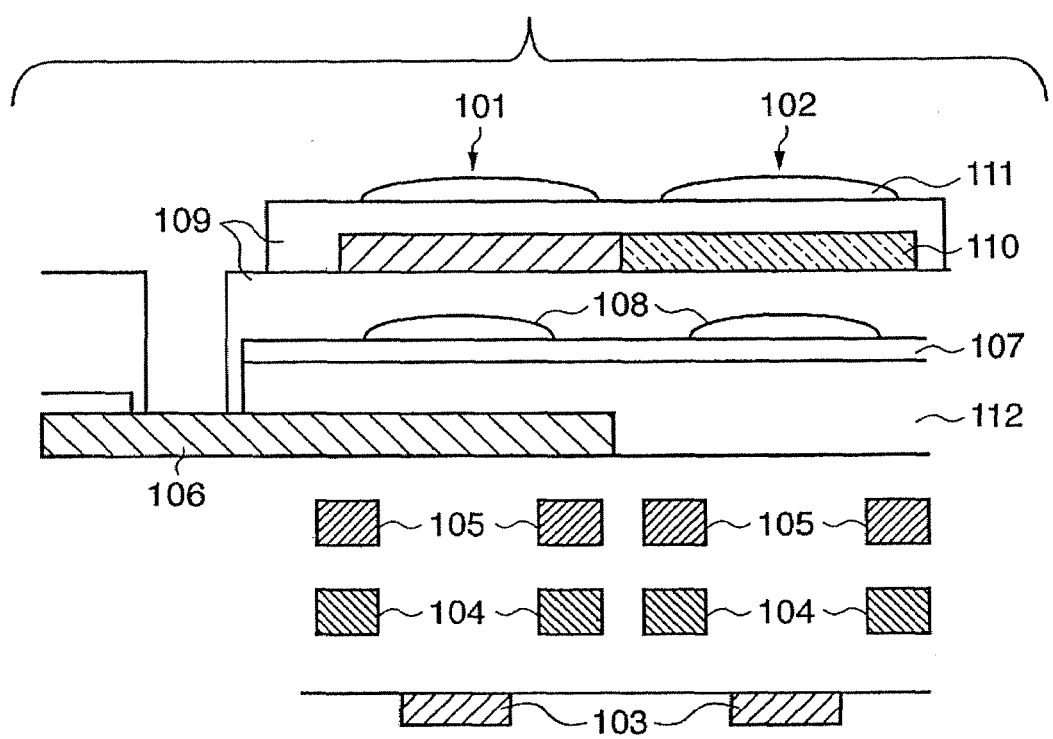
FIG. 16 is a sectional view of the configuration of a solid-state image sensing device designed on the basis of a conventional example.

FIG. 1 is a diagram showing a sectional view of a solid-state image sensing device of a first embodiment of the present invention. It should be noted that, in FIG. 1, elements that are the same as those shown in FIG. 16 are assigned the same reference characters and a description thereof is omitted. In the configuration shown in FIG. 1, the flattening using the flattening film 112 shown in FIG. 16 is not performed and the passivation film part 107 is formed directly on the interlayer dielectric and the third metal wiring layer 106, with the height difference with the third metal wiring layer 106 not covered but left as is.

With such a construction, the configuration shown in FIG. 1 of the present embodiment can be made thinner by an amount equal to the flattening film 112 that covers the height difference of the topmost metal layer. Therefore, compared to the configuration shown in FIG. 16, the height from the photoelectric converter element 103 of the light-receiving area pixel 102 to the bottom of the inner lens 108 can be lowered. As a result, the light collecting efficiency can be increased, and in particular a decrease in sensitivity when the F number is small can be remedied.

Figure 2:
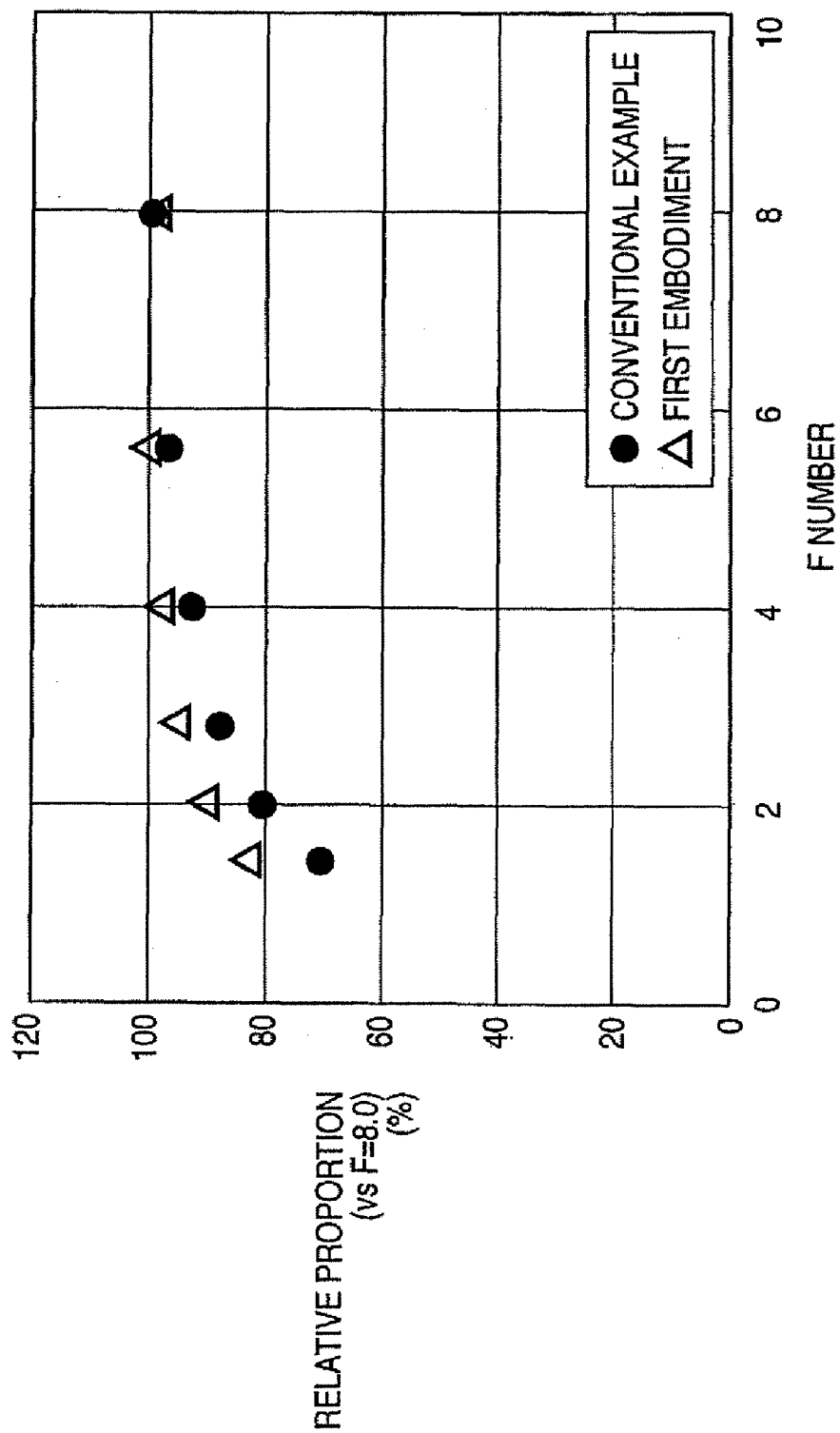
FIG. 2 is a diagram illustrating the improvement effect of the solid-state image sensing device according to the first embodiment of the present invention.

FIG. 2 shows the F number dependency characteristics of the configuration of the present embodiment and the configuration shown in FIG. 16. As shown in FIG. 2, with the configuration of the first embodiment the sensitivity when the F number is small is improved compared to the configuration employing the conventional technique shown in FIG. 16.

Next, a description will be given of steps in the production of the solid-state image sensing device according to the first embodiment of the present invention shown in FIG. 1, with reference to FIGS. 3 through 10.

Figure 3:
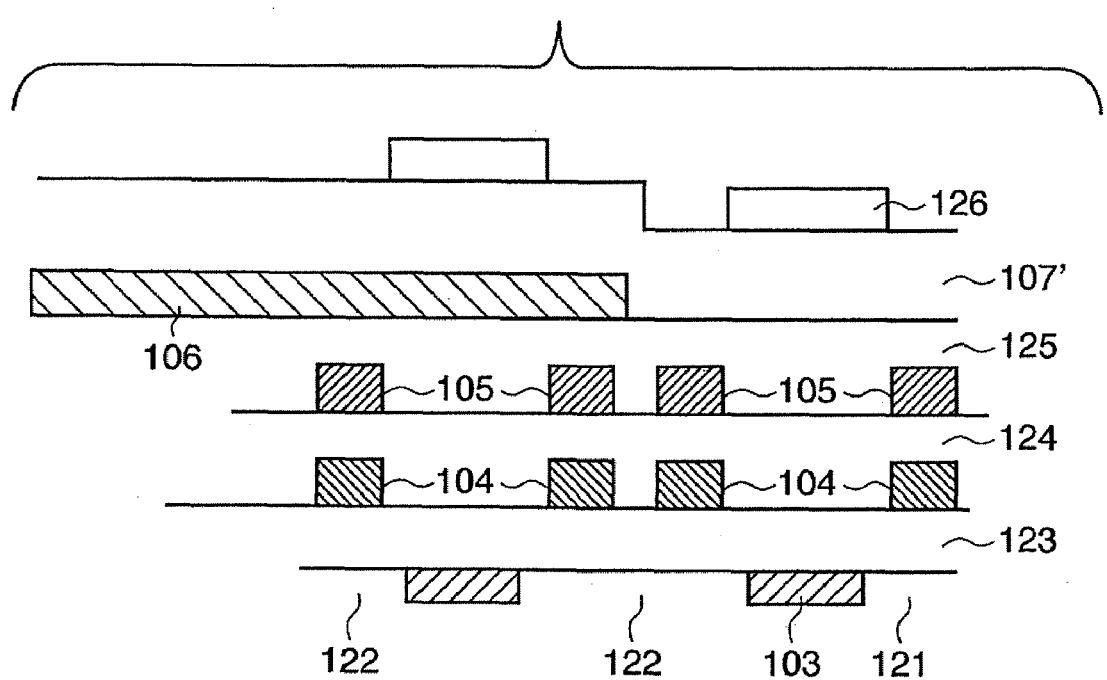
FIG. 3 is a diagrams illustrating a method of manufacturing the solid-state image sensing device shown in FIG. 1.

First, as shown in FIG. 3, a semiconductor member 121 composed of a silicon wafer or the like is prepared and an element separation area 122 is formed on the semiconductor member 121 by LOCOS (LOCal Oxidation of Silicon), STI (Shallow Trench Isolation) or the like. Next, a photo-resist pattern is formed, ion-injection and heating processes are performed, and, for example, a diffusion layer that becomes the cathode or the anode of a photodiode (photoelectric converter element 103) is formed on the semiconductor member 121.

Then, by thermal oxidation, CVD (Chemical Vapor Deposition), sputtering, coating or the like, a first dielectric 123 is formed on the semiconductor member 121. The top surface of the first dielectric 123 is flattened by CMP (Chemical Mechanical Planarization) or the like, enabling the accuracy of the patterning of the next process to be improved.

Next, a metal film consisting of Al, Mo, W, Ta, Ti or Cu, or an alloy composed chiefly of these elements, is formed on the first dielectric 123 by sputtering, CVD, electro-plating or the like. Further, by removing by etching a portion located above the light-receiving surface of the photoelectric converter element 103, a first pattern (first metal wiring layer) 104 of a desired shape is formed.

Next, a second dielectric 124 consisting of SiO or a material composed chiefly of SiO is formed on the first dielectric 123 and the first metal wiring layer 104 by CVD. The top surface of the second dielectric 124 is flattened by CMP or the like to enable the accuracy of the patterning of the next process to be improved.

Next, a metal film consisting, like the first metal wiring layer 104, of Al, Mo, W, Ta, Ti or Cu, or an alloy composed chiefly of these elements, is formed on the second dielectric 124 by sputtering, CVD, electro-plating or the like. Further, by removing by etching a portion located above the light-receiving surface of the photoelectric converter element 103, a second pattern (second metal wiring layer) 105 of a desired shape is formed.

It should be noted that the first and second metal wiring layers 104, 105, in addition to functioning as wiring used in the transmission of electrical signals from the photoelectric converter element 103, also functions as light-shielding planes that prevents light that should enter one photoelectric converter element 103 from entering another photoelectric converter element 103.

Next, a third dielectric 125 consisting of SiO or a material composed chiefly of SiO is formed on the second dielectric 124 and the second metal wiring layer 105 by CVD. The top surface of the third dielectric 125 is flattened by CMP or the like, enabling the accuracy of the patterning of the next process to be improved.

Next, a metal film consisting, like the first pattern 104 and the second pattern 105, of Al, Mo, W, Ta, Ti or Cu, or an alloy composed chiefly of these elements, is formed on the third dielectric 125 by sputtering, CVD, electro-plating or the like. Further, by removing by etching a portion located above the light-receiving surface of the photoelectric converter element 103, a third pattern (third metal wiring layer) 106 of a desired shape is formed. The third metal wiring layer 106 is formed in an area outside an effective pixel area and also includes a light-shielding member for forming a light-shielded area (optical black) for creating a reference signal.

Next, a passivation layer/inner lens formation film 107' composed of SiN, SiON or SiO and the like is formed on the third metal wiring layer 106 and the third dielectric 125 by CVD.

Figure 4:
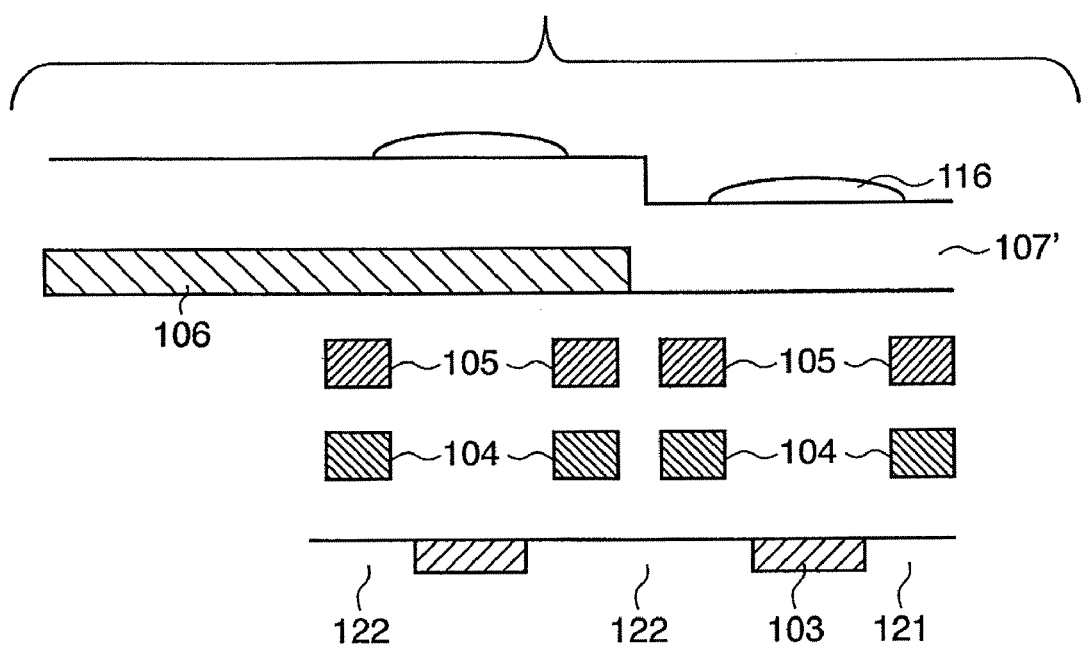
FIG. 4 is a diagrams illustrating the method of manufacturing the solid-state image sensing device shown in FIG. 1.

Then, as shown in FIG. 3, an etching mask 126 for forming the inner lens 108 is formed on the passivation layer/inner lens formation film 107' by photolithography. Thereafter, as shown in FIG. 4, the etching mask 126 is heated and reflowed to form a convex lens having substantially the same shape as the shape of the inner lens 108. It should be noted that, in the present embodiment, the inner lens is also formed in the light-shielded area.

Figure 5:
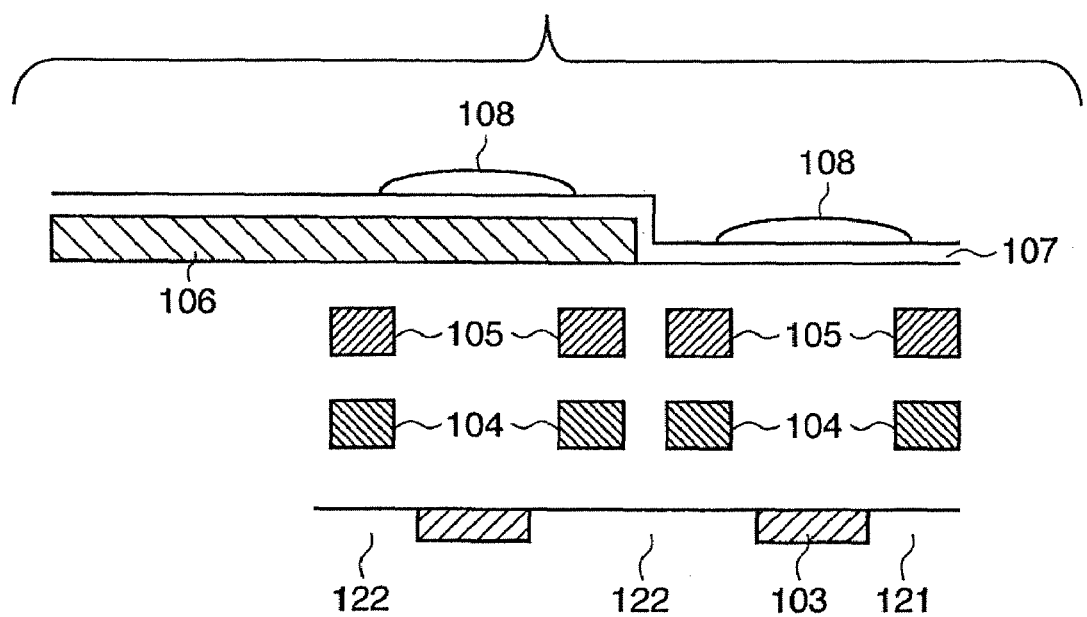
FIG. 5 is a diagrams illustrating the method of manufacturing the solid-state image sensing device shown in FIG. 1.

Next, etching is performed over the entire passivation layer/inner lens formation film 107', and as shown in FIG. 5 the convex lens shape of the etching mask 126 is transferred to the passivation layer/inner lens formation film 107' to form the inner lenses 108. For the etching gas, $CF_4$, $CHF_3$, $O_2$, Ar, He and the like can be used. The portions of the passivation layer/inner lens formation film 107' that remain after etching become the passivation layer 107.

Figure 6:
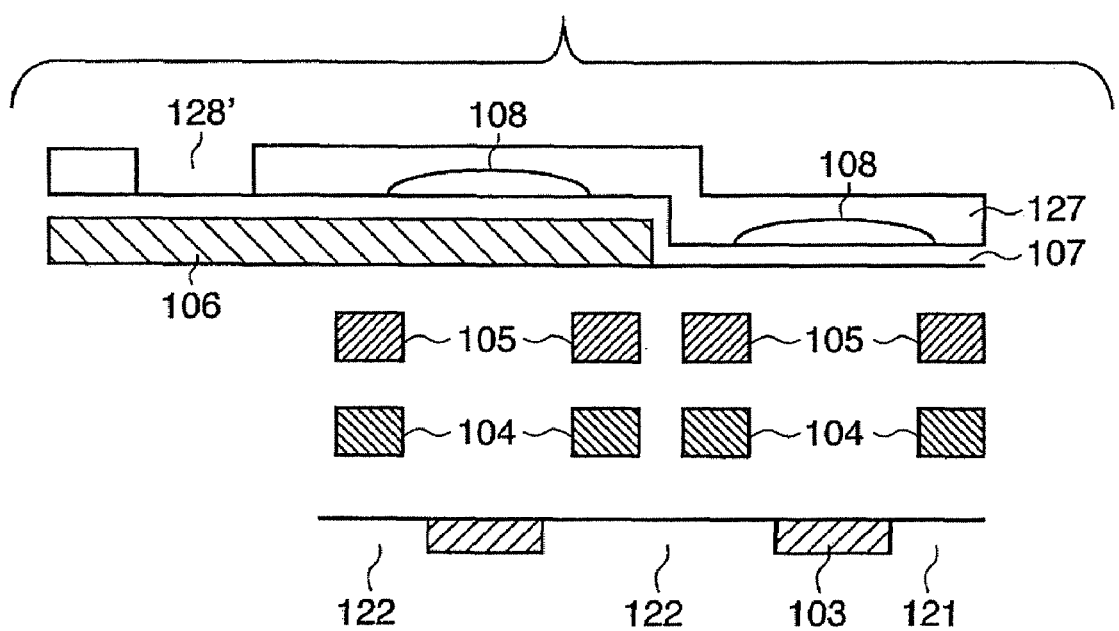
FIG. 6 is a diagrams illustrating the method of manufacturing the solid-state image sensing device shown in FIG. 1.
Figure 7:
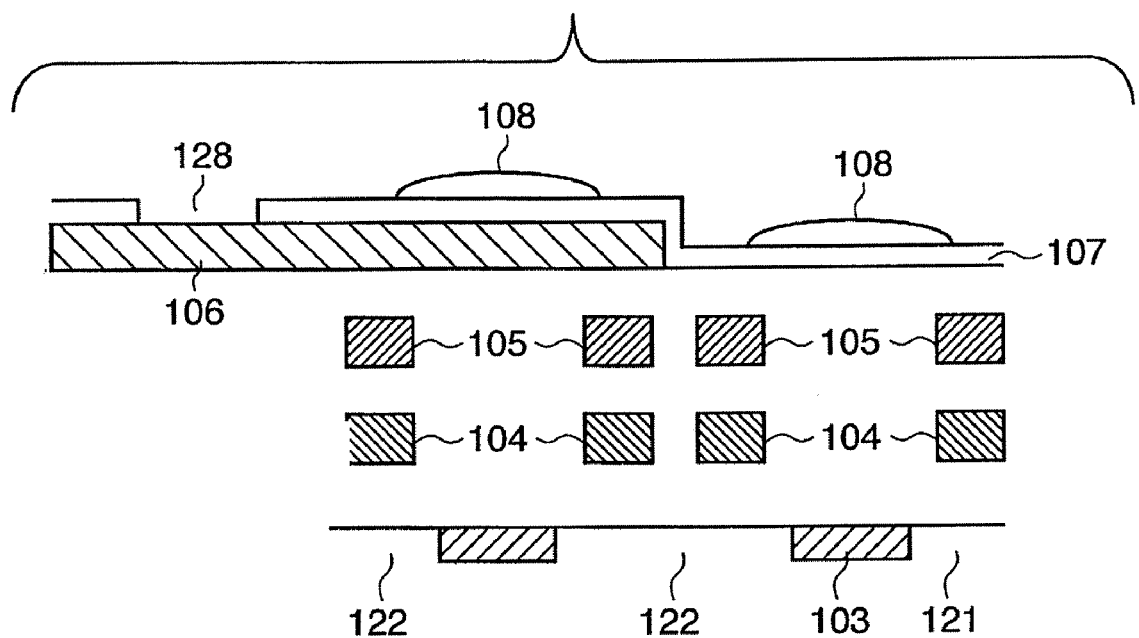
FIG. 7 is a diagrams illustrating the method of manufacturing the solid-state image sensing device shown in FIG. 1.

Then, as shown in FIG. 6, in order to open a pad part 128' by photolithography, a resist pattern 127 having such an opening pattern is formed on the passivation layer 107 and the inner lenses 108. Then, as shown in FIG. 7, the passivation layer 107 located above the pad part 128 is removed by photolithography.

Figure 8:
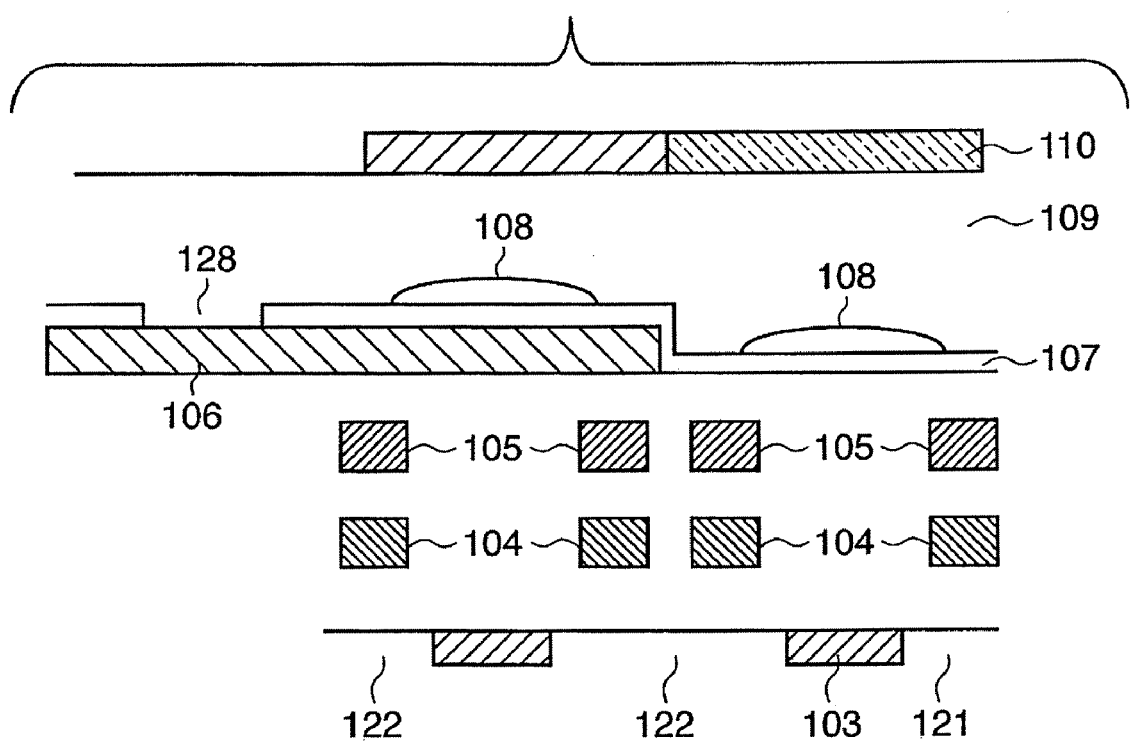
FIG. 8 is a diagrams illustrating the method of manufacturing the solid-state image sensing device shown in FIG. 1.

Thereafter, as shown in FIG. 8, the first flattening film 109 is formed on the pad part 128, the passivation layer 107 and the inner lenses 108, and a color filter layer 110 is formed on the first flattening film 109. The color filter layer 110 has a color pattern that selects the color of the light stroking on the photoelectric converter elements 103 underneath the color filter layer 110.

Figure 9:
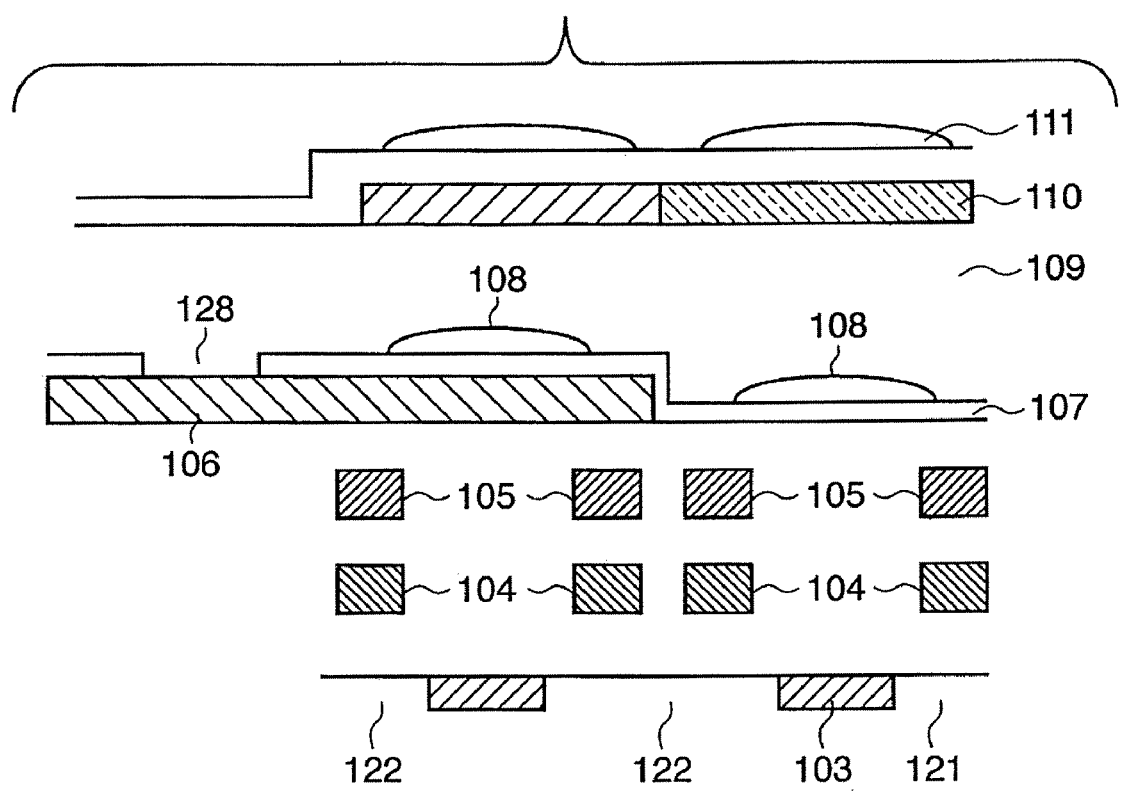
FIG. 9 is a diagrams illustrating the method of manufacturing the solid-state image sensing device shown in FIG. 1.
Figure 10:
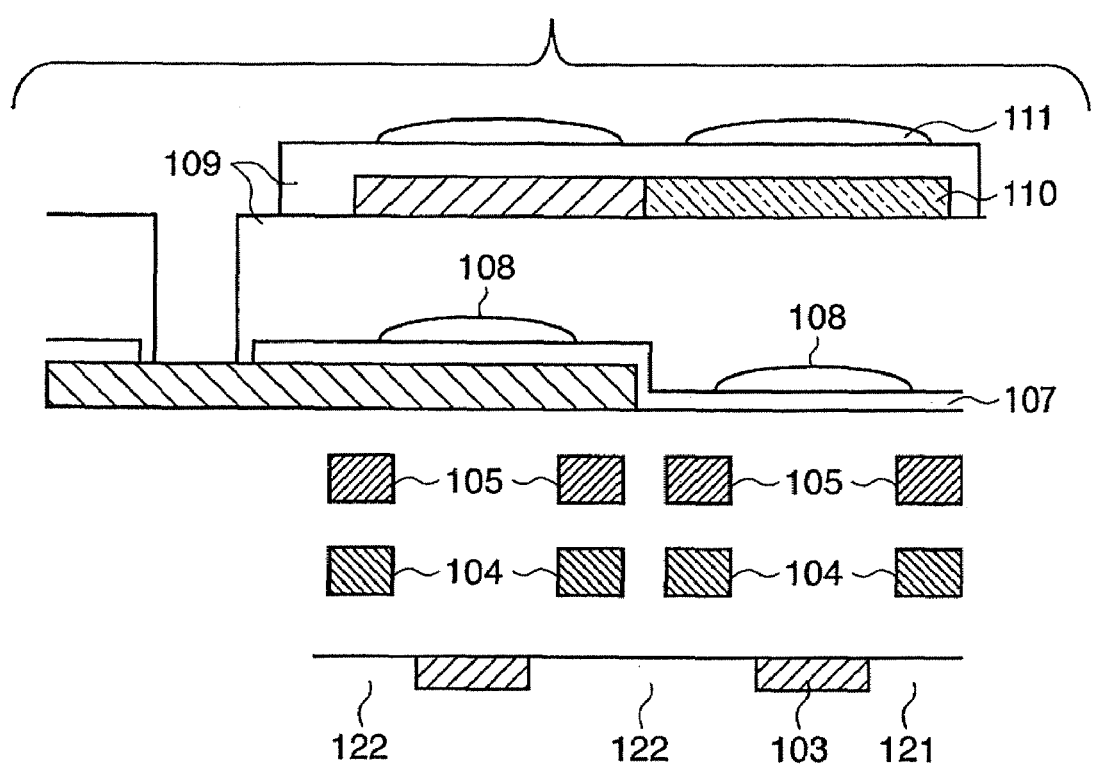
FIG. 10 is a diagrams illustrating the method of manufacturing the solid-state image sensing device shown in FIG. 1.

Then, as shown in FIG. 9, a second flattening film 109 is formed on the color filter layer 110, and microlenses 111 are formed thereon using resist patterning and reflow. Finally, as shown in FIG. 10, the first and second flattening films 109 that remain on the pad part 128 are removed by etching so as to open the pad part 128 upward.

Through the steps described above the solid-state image sensing device shown in FIG. 1 can be manufactured.

Second Embodiment

Next, a description will be given of a second embodiment of the present invention.

Figure 11:
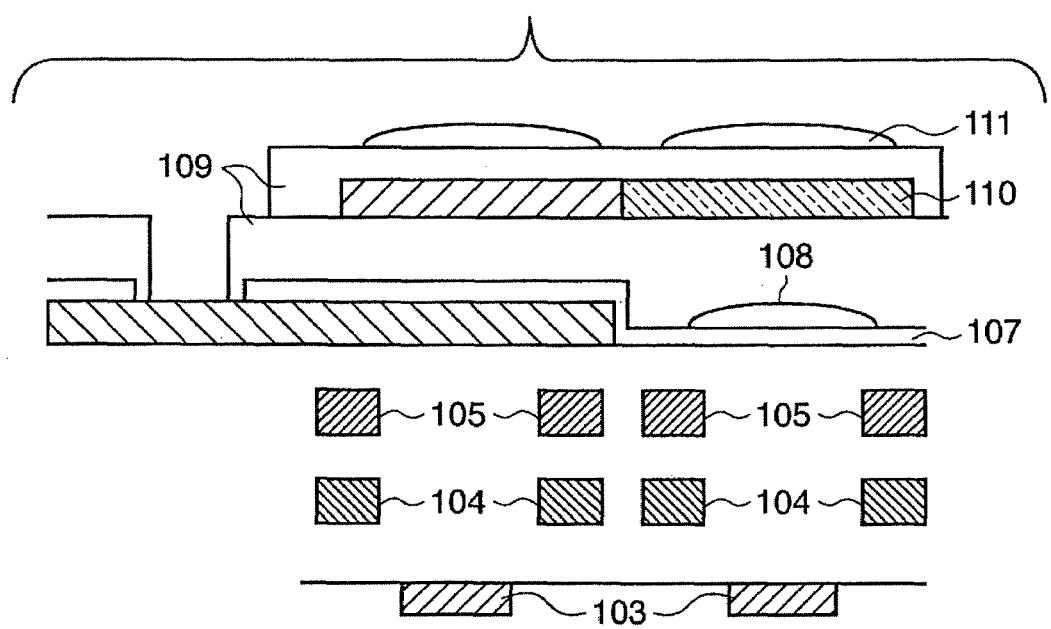
FIG. 11 is a sectional view of the configuration of a solid-state image sensing device according to a second embodiment of the present invention.

FIG. 11 is a diagram showing a sectional view of a solid-state image sensing device according to a second embodiment of the present invention, showing an edge part of an solid-state image sensing device having a light-receiving area and a light-shielded area. In FIG. 11, elements identical to those shown in FIG. 1 are assigned identical reference numerals and descriptions thereof are omitted.

In the configuration shown in FIG. 1, an inner lens 108 is also formed on the third metal wiring layer 106 that is the light-shielded area, and therefore, in order to prevent the microlens 111 formed at the boundary between the light-receiving area and the light-shielded area from tilting when formed, the first flattening film 109 must be made thick.

By contrast, with the configuration of the second embodiment shown in FIG. 11, no inner lens 108 is formed on the third metal wiring layer 106 that is the light-shielded area. As a result, the first flattening film 109 can be made thinner than that in the configuration shown in FIG. 1. Consequently, light collecting efficiency can be increased, and in particular a decrease in sensitivity when the F number is small can be further remedied.

Figure 12:
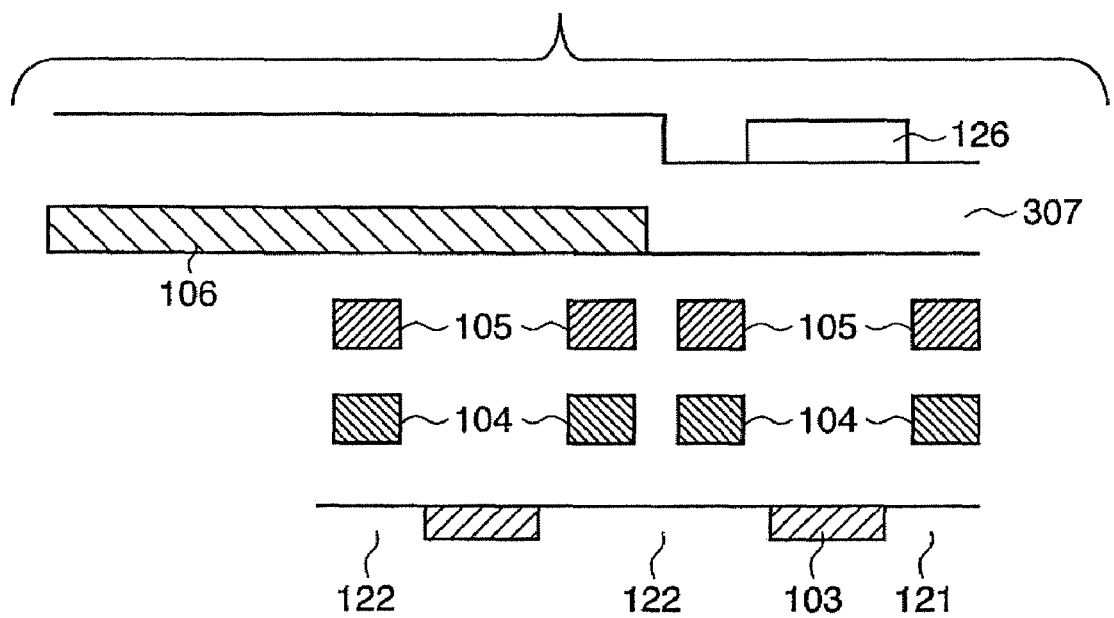
FIG. 12 is a diagram illustrating a method of manufacturing the solid-state image sensing device shown in FIG. 11.

The method of manufacturing the configuration shown in FIG. 11, though it differs from the method described above insofar as an etching mask 126 for forming the inner lens 108 is not formed in the light-shielded area as shown in FIG. 12, is otherwise the same as the method of manufacturing the first embodiment described above, and therefore a description thereof is omitted here. It should be noted that the step shown in FIG. 12 corresponds to the step shown in FIG. 3.

According to the second embodiment, the distance from the photoelectric converter 3 to the microlenses 111 can be reduced, enabling light collecting efficiency to be further increased.

(Variations)

Figure 13:
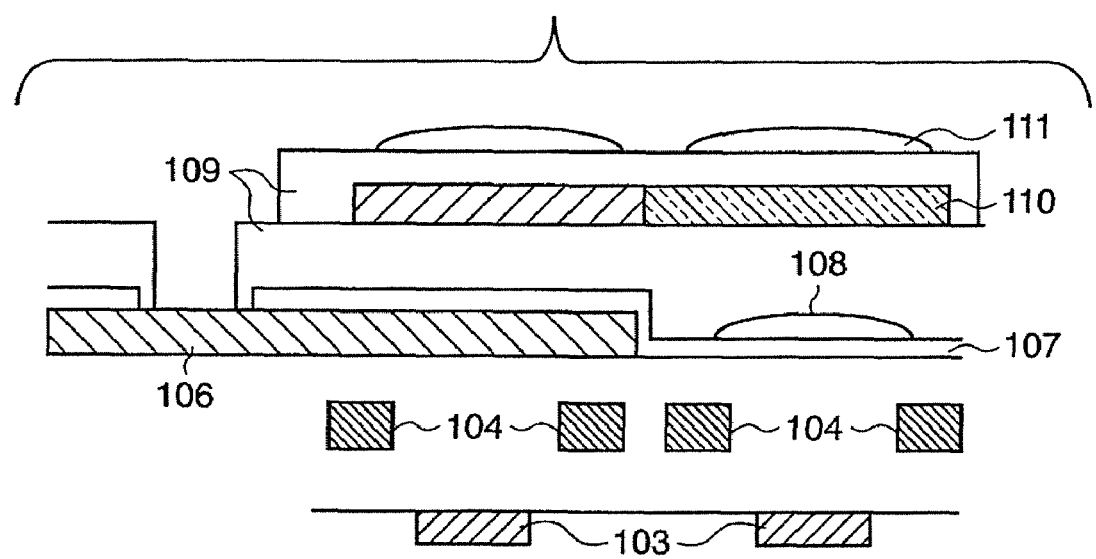
FIG. 13 is a sectional view of a configuration of another solid-state image sensing device of the present invention.

FIG. 13 shows a sectional view of another solid-state image sensing device of the present invention, showing an edge part of a solid-state image sensing device having a light-receiving area and a light-shielded area. In FIG. 13, elements identical to those shown in FIG. 1 are assigned identical reference numerals and descriptions thereof are omitted. Unlike the first and second embodiments described above, the configuration shown in FIG. 13 has only the first metal wiring layer 104, without the second metal wiring layer 105.

Figure 14:
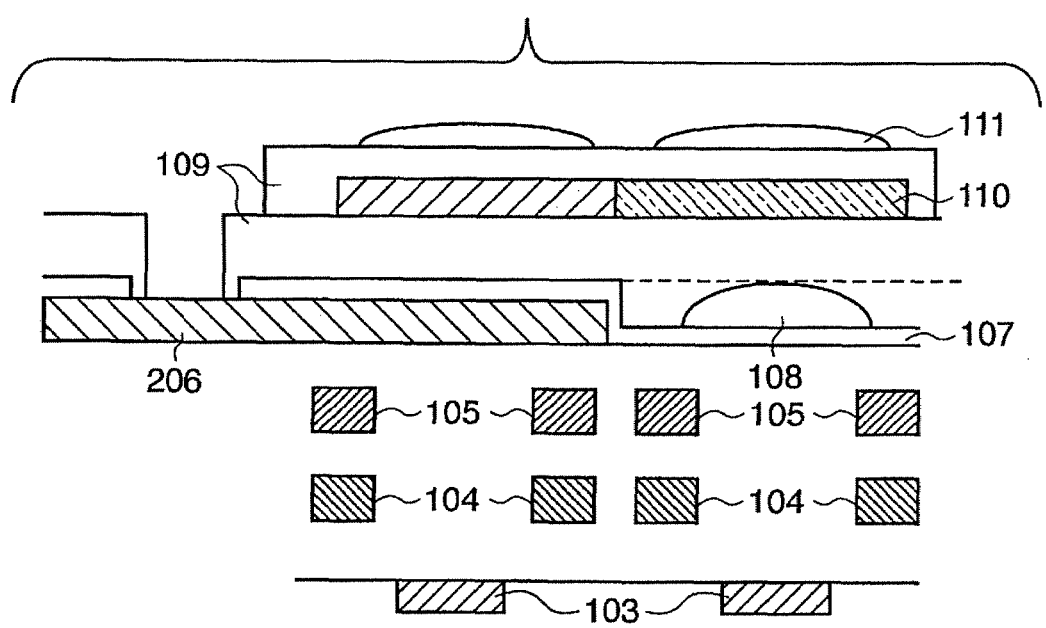
FIG. 14 is a sectional view of a configuration of another solid-state image sensing device of the present invention.
Figure 15:
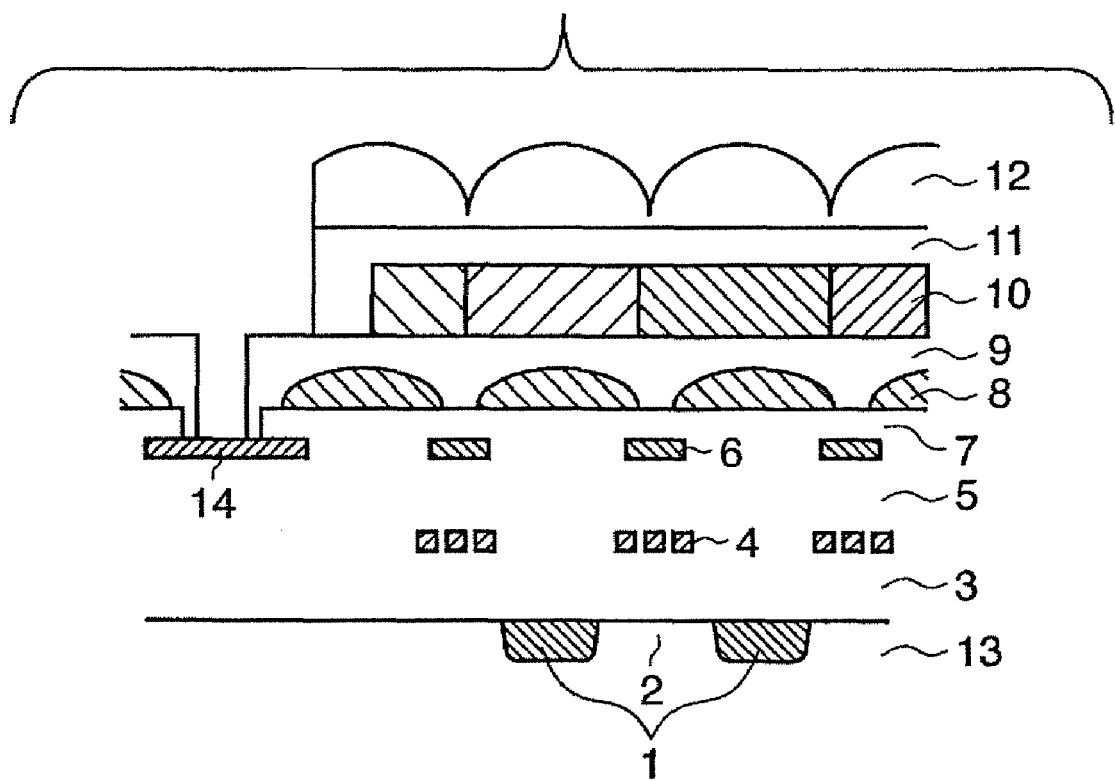
FIG. 15 is a sectional view of the configuration of a conventional solid-state image sensing device.

In addition, FIG. 14 shows a sectional view of another solid-state image sensing device of the present invention, showing an edge part of a solid-state image sensing device having a light-receiving area and a light-shielded area. In the configuration shown in FIG. 14, the thickness of the third metal wiring layer 206 is thinner than that of the third metal wiring layer 106 of the second embodiment and the thickness of the inner lens 108 is formed substantially the same as the height difference of the passivation layer 107.

Thus, as described above, in the configurations shown in FIG. 13 and FIG. 14, the height from the photoelectric converter element 103 of the light-receiving area pixel 102 to the bottom of the inner lens 108 can be lowered, enabling light collecting efficiency to be increased.

As many apparently widely different embodiments of the present invention can be made without departing from the spirit and scope thereof, it is to be understood that the invention is not limited to the specific embodiments thereof except as defined in the appended claims.

This application claims the benefit of Japanese Patent Application No. 2005-195281 filed on Jul. 4, 2005, which is hereby incorporated herein by reference herein in its entirety.

What is claimed is:

1. A solid-state image sensing device having an effective pixel area that carries out photoelectric conversion according to a quantity of incident light and an optical black area for making a reference signal, the effective pixel area and the optical black area being disposed on one principal surface of a substrate, the solid-state image sensing device comprising:

photoelectric converter elements;

a wiring part that includes a plurality of wiring layers disposed on the one principal surface of the substrate, in which in the optical black area more wiring layers are disposed than in the effective pixel area, with a first wiring layer being disposed in the optical black area and not in the effective pixel area;

an interlayer dielectric disposed between the first wiring layer and a second wiring layer disposed beneath the first wiring layer;

a passivation film disposed on the interlayer dielectric in the effective pixel area and disposed on the first wiring layer in the optical black area; and inner lenses, convex in shape toward incoming light, disposed at least at positions on the passivation film that correspond to the effective pixel area, wherein a distance between a top surface of the interlayer dielectric and a top surface of the passivation film in the optical black area is longer than a distance between the top surface of the interlayer dielectric and a top surface of the inner lenses in the effective pixel area.

2. The solid-state image sensing device according to claim 1, wherein the first wiring layer functions as a light-shielding layer.

3. The solid-state image sensing device according to claim 1, wherein no inner lens is arranged in the optical black area.

4. The solid-state image sensing device according to claim 1, wherein a thickness of the first wiring layer is substantially identical to a thickness of the light-shielding layer.

5. The solid-state image sensing device according to claim 1, wherein the passivation film includes a film made of SiN, SiON, or SiO.

6. The solid-state image sensing device according to claim 1, wherein the passivation film and the inner lenses are integrally formed as a same layer.

7. The solid-state image sensing device according to claim 1, wherein the top surface the interlayer dielectric is flattened.

* * * * *